United States Patent [19]

Cheung

[11] Patent Number: 4,871,962
[45] Date of Patent: Oct. 3, 1989

[54] METHOD FOR MEASURING THE SIZE OF VIAS

[75] Inventor: Robin W. Cheung, Cupertino, Calif.

[73] Assignee: Advanced Micro Devices, Inc., Sunnyvale, Calif.

[21] Appl. No.: 263,906

[22] Filed: Oct. 28, 1988

[51] Int. Cl.$^4$ .............................................. G01R 27/14
[52] U.S. Cl. ...................................... 324/65 R; 324/64
[58] Field of Search ...................... 324/65 R, 65 P, 64, 324/557, 559; 33/542, 544, 178 E

[56] References Cited

U.S. PATENT DOCUMENTS

| | | | |
|---|---|---|---|
| 3,392,324 | 7/1968 | Hermann et al. | 324/73 PC |
| 4,516,071 | 5/1985 | Buehler | 324/65 R |
| 4,697,142 | 9/1987 | Frushour | 324/73 PC |

FOREIGN PATENT DOCUMENTS 2161936  1/1986  United Kingdom .................. 324/64

OTHER PUBLICATIONS

Bane, Randy, "Getting Plugged into Electrical Linewidth Measurements", *Test and Measurement World*, Apr. 1987, pp. 102–108.

Buehler, M. G. et al., "Bridge and van der Pauw Sheet Resistors for Characterizing the Line Width of Conducting Layers", *Journal of Electrochemical Society: Solid-State Science and Technology*, vol. 125, No. 4, Apr. 1978, pp. 650–655.

"Brochure Insert #01", *Prometrix Product Information Brochure*, Prometrix Corp. of Santa Clara, CA, Jul. 1987.

IBM Technical Disclosure, vol. 23, No. 9, Feb. 1981, "Testing Printed Circuitry", Meier.

*Primary Examiner*—Reinhard J. Eisenzopf
*Assistant Examiner*—Maura K. Regan
*Attorney, Agent, or Firm*—John P. Taylor

[57] ABSTRACT

A method is disclosed for measuring or verifying the size of an opening such as a via in a layer of material such as found in an integrated circuit structure which comprises measuring the voltage drop while flowing a known current across a given length of a first rectangular test portion comprising a continuous layer of a material capable of carrying an electrical current, then measuring the voltage drop while flowing the same known current across the same length of a second rectangular test portion comprising another portion of the same layer of material and of identical width and measured length as the first test portion but with one or more openings formed therein, and determining the size of the one or more openings in the second test pattern from the measured difference in voltage drops between the first and second test patterns reflecting the difference in resistance between the solid test portion and the test portion containing the openings. The size of the openings in the second test pattern are determined by using the measured voltage drops together with the measured sheet resistance of the conductive material.

12 Claims, 2 Drawing Sheets

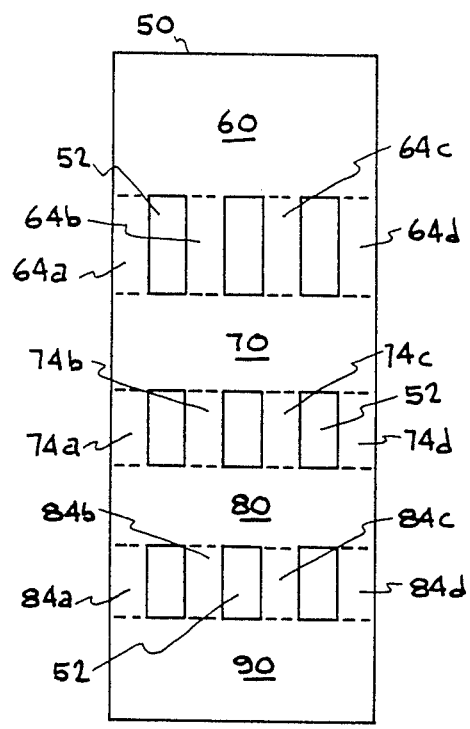
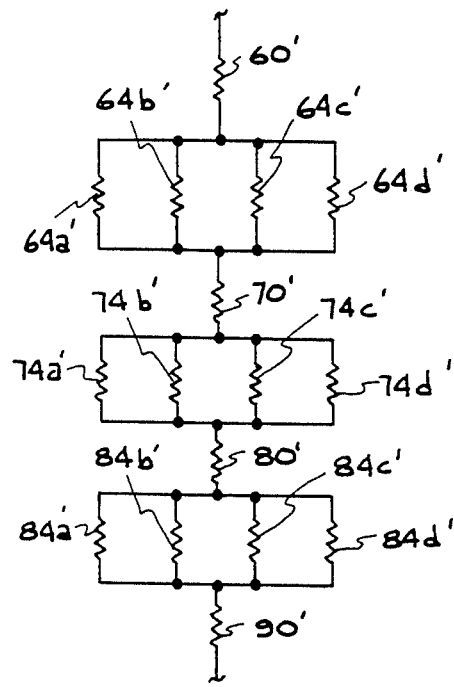
FIG. 1A        FIG. 1B
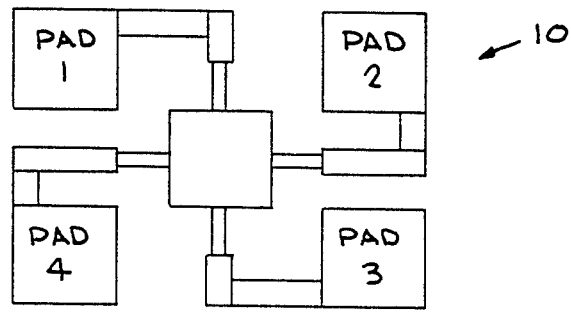
FIG. 2

METHOD FOR MEASURING THE SIZE OF VIAS

BACKGROUND OF THE INVENTION

1. Field of the Invention

This invention relates to a method for electrically measuring the size of openings. More particularly, this invention relates to a method of electrically measuring the size of vias in an integrated circuit structure.

2. Description of the Related Art

In the fabrication of integrated circuit structures, the ever increasing density of devices, including the interconnects between devices, has resulted in the size of both the devices and their interconnects becoming smaller and smaller. This, in turn, has resulted in the need for high resolution photolithography to accurately position and construct devices and their interconnects on a substrate. As a result, lines of widths as small as 1 micron or less are now frequently employed in integrated circuit structures.

Accurate measurement of the width of such lines to verify the photolithography is difficult. For example, the use of scanning electron microscopy (SEM) is not always satisfactory because the edge of the line may be hard to define if the line becomes electrically charged.

More recently, measurement of the width of such fine lines has been made by electrical measurements. Test patterns of the same layer of conductive material are patterned on a wafer, including test patterns of lines of the same line width, i.e., laid out using the same photolithography. The sheet resistance of the conductive layer is determined and then a known current is passed along a line of known length and the voltage drop along the known length is measured. From these measurements, the width of the fine line may be accurately calculated.

While this technique has been successful in the measurement of line widths of fine lines used in VLSI integrated circuit structures, the measurement of the size of the vias or openings used for vertical interconnects between conductive layers has still has remained difficult. It would, therefore, be desirable to provide a technique where the size of such openings could be accurately monitored.

SUMMARY OF THE INVENTION

It is, therefore, an object of this invention to provide a method for electrically monitoring the size of an opening in a layer of a material in an integrated circuit structure.

It is another object of this invention to provide a method for monitoring the size of an opening in a layer of a material in an integrated circuit structure by electrically monitoring the size of an identical opening formed in a layer of conductive material.

It is yet another object of this invention to provide a method for monitoring the size of an opening in a layer of a material in an integrated circuit structure by electrically monitoring the size of an identical opening formed in a layer of conductive material by electrically measuring the voltage drop of a first test pattern of the conductive material having no openings therein when a current is passed through the test pattern and comparing this with the voltage drop across a second test pattern formed from the same conductive layer and of identical width and length but having one or more of such openings therein when the same current is passed through the second test pattern.

These and other objects of the invention will be apparent from the following description and accompanying drawings.

BRIEF DESCRIPTION OF THE DRAWINGS

FIG. 1A is a top view of a test pattern shown comprising a conductive sheet formed with rectangular openings for illustrative purposes.

FIG. 1B is a an electrical schematic showing the resistance equivalent to the test pattern shown in FIG. 1A.

FIG. 2 is a top view of a typical test pattern, including measurement pads, used in the prior art to determine, the sheet resistance of a layer of material capable of carrying an electric current.

DETAILED DESCRIPTION OF THE INVENTION

Figure 3:
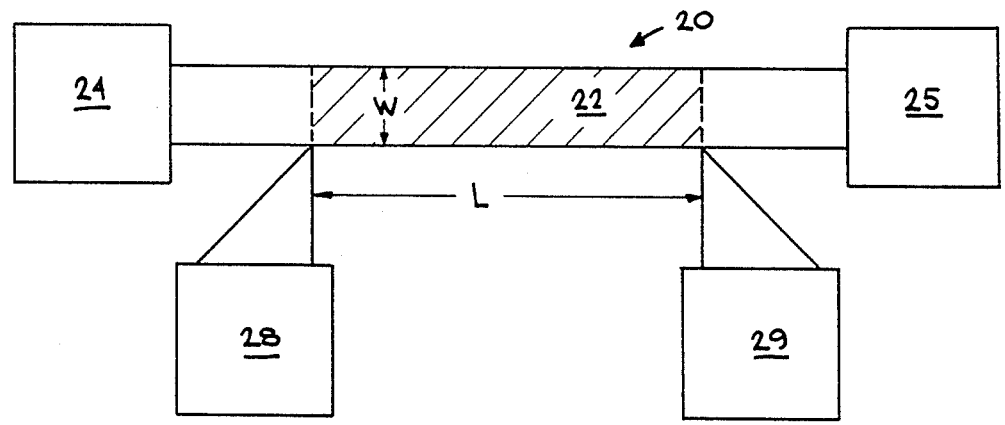
FIG. 3 is a top view of a typical test pattern, including measurement pads, used in the prior art and used as the control to determine the line width of a solid line or rectangle of known length.

The invention comprises a method of monitoring or measuring the size of vias or openings formed by photolithography in a layer of material, which may comprise a dielectric, by electrically measuring the size of identical vias formed in a layer of conductive material. This is accomplished by forming two test patterns or portions of the same conductive layer material of identical width, with one test pattern containing one or more of such vias or openings, and the other test pattern comprising a continuous layer without such openings.

The size of the vias formed in one of the two test portions is monitored or measured by measuring the voltage drop along the same length of each test portion while passing the same amount of current through each test pattern. From these voltage measurements, together with a measurement of the sheet resistance of the conductive film of material, the difference in resistance between the two test patterns for the particular length for which the voltage was measured can be determined and from this difference in resistance the size of the openings formed in the conductive layer from the photomask may be determined and differences in size monitored by the differences in the voltage drop.

The measured voltage drop in the test pattern containing the openings may also be compared against the theoretical voltage drop calculated for a given size and number of openings. In this connection, the measured voltage drop may also be compared with a table derived from previous measurements and/or calculations to monitor whether the opening size in the test pattern corresponds to the desired opening size of the insulating layer in the integrated circuit structure which is actually being monitored.

In actual practice, the size of a via, which may be formed in an insulating layer of a first wafer, may thus be determined by using the same photolithography to form an identical via or group of vias in a test pattern formed from a conductive film on a test wafer. (It is, of course physically possible, but not economically practical, to use the same wafer for both.)

By forming on the test wafer a second test pattern of the same width (but without any openings in the film) and by testing the voltage drop along the identical length on each test pattern as well as determining the sheet resistance of the conductive film, the size of the via in the conductive film may be determined which, in turn, should be identical to the size of the unknown via in the insulating film.

By use of the term "conductive film" is meant a film capable of passing a measurable current from a first point to a second point with a measurable voltage drop between the two points.

It should be noted that what is being ultimately measured or verified by the practice of this invention is the size of the opening in the photolithography pattern or mask used to form the opening, regardless of what type of material the opening is formed in by means of the photolithography.

However, since a via or opening is usually formed through an insulating layer in the actual construction of integrated circuit structures and the method of the invention relies on the differences in measured conductivity of a solid conductive film or pattern versus one formed with the vias of unknown or unconfirmed size, a conductive film must be used to form the test pattern necessary for the measurements.

FIGS. 1A and 1B illustrate how the invention functions in its simplest form by showing a series of rectangular openings 52 formed in a conductive sheet or test pattern 50 leaving strips 64a–64d, 74a–74d, and 84a–84d in between openings 52. An end portion 60 joins strips 64a–64d together at one end of the first row of openings 52 and strips 64a–64d are similarly joined together at their opposite ends to common strip or portion 70. Portion 70 in turn connects strips 74a–74d together at one end while another common strip or portion 80 joins the opposite ends of strips 74a–74d together. Common strip 80 also connects together strips 84a–84d between the third row of holes 52 and finally a common strip 90 joins together the opposite ends of strips 84a–84d.

By comparing the physical structure of FIG. 1A to the electrical equivalent circuit or schematic shown in FIG. 1B, wherein primes are used after the equivalent numerals used therein relative to FIG. 1A, it can be seen that common portions 60, 70, 80, and 90 of FIG. 1A function as low resistance resistors in series corresponding to the respective lengths in sheet 50 where no openings are formed, whereas each of the strips groups 64a64d, 74a–74d, and 84a–84d of FIG. 1A function respectively as parallel high resistance resistors.

Referring then to FIG. 1B, the current path thus first flows through resistor 60', then splits through resistors 64a'-64d', then flows through resistor 70', then splits through resistors 74a'-74d', then flows through common resistor 80', and then splits again through resistors 84a'-84d' before finally flowing through resistor 90'. Thus, the measurement of current flow through sheet or test pattern 50 with openings will show a larger voltage drop than would another sheet of the same material having identical width, length, and thickness, but having no openings due to the higher resistance of the sheet with openings. This difference in voltage drop is used to monitor the size of the openings or vias formed in one of the test patterns as will now be described.

Turning to FIG. 2, a van der Pauw sheet resistance structure 10 is shown which may be used to determine the sheet resistance of a conductive film or layer of material. Such measurements are well known in the prior art and while the measured result is used in the present invention in electrically measuring the areas of the respective test portions, the actual means of determining the sheet resistance using a van der Pauw structure forms no part of the present invention. Sheet resistance measurements using van der Pauw structures are described by Bane in an article entitled "Getting Plugged into Electrical Linewidth Measurements", published in Test and Measurement World in April, 1987, at pp. 102–108 and in product information literature Insert #101 distributed by Prometrix Corp. of Santa Clara, Calif., dated July, 1987.

The sheet resistance $R_s$ of the conductive film is determined by measuring the van der Pauw structures by first passing a known current $I_1$ through pads 1 and 4 shown in FIG. 2 while measuring the resulting voltage drop $V_1$ between pads 2 and 3 to obtain a first resistance value $R_1 = V_1 I_1$ and then passing the same current $I_1$ through pads 1 and 4 while measuring the voltage drop $V_2$ between pads 3 and 4 to obtain a second resistance $R_2$. The sheet resistance $R_s$ may then be calculated using the following formula:

$$R_s = (pi/\ln 2) \times (R_1 + R_2)/2 \times (R_1/R_2) \qquad (1)$$

Referring now to FIG. 3, a test portion or pattern 20 is shown comprising another section of the same conductive film used in forming the van der Pauw structure 10 shown in FIG. 2, i.e., van der Pauw structure 10 and test pattern 20 have the same sheet thickness so that the sheet resistance determined from the van der Pauw structure may be used in determining the area of test pattern 20.

Still referring to FIG. 3, to calculate the area $A_{22}$ of shaded region or area 22 from the measured voltage drop across the test pattern when a known amount of current is flowed across the test pattern, it is necessary to determine the width W of area 22. This measurement or determination is the electrical linewidth measurement previously discussed which has been used by the prior art to successfully determine the linewidth of very narrow lines, e.g., of 1 micron or less.

To determine width W of area 22, a current of known value I is passed through area 22 from pad 24 to pad 25. The voltage drop $V_{22}$ across the length L of area 22 is then measured between pads 28 and 29. It must be pointed out that length L is a much larger dimension than width W and is, therefore, a known value which is determined by other means.

After measuring the voltage drop $V_{22}$ when passing current I across area 22, the width W may be calculated using the following equation based on Ohms Law:

$$V_{22} = (L/W \times Re_{22}) \times I \qquad (2)$$

where the resistance is represented by the term $(L/W \times Re_{22})$, i.e., the resistance is equal to the length L divided by the width W times the resistivity $Re_{22}$ of the sheet or test pattern. Solving this equation for the width W:

$$W = L \times Re_s/(V_{22}/I) \qquad (3)$$

Alternatively, when width W of shaded region 22 is known, e.g., the width W on the photolithography mask is known, and one wishes to verify this width (as transferred to the test pattern from the mask) by electrical measurement of the test pattern, equation (2) may be used to calculate the theoretical voltage, and then the measured voltage may be compared with the theoretically calculated voltage to verify the width.

In either case, after determining or verifying the width W, the area $A_{22}$ of area or region 22 may then be determined or verified by multiplying the length L times the measured or verified width W of area 22.

$$A_{22} = L \times W \tag{4}$$

The area value $A_{22}$ may also be expressed, by combining previous equations (3) and (4), as:

$$A_{22} = L \times L \times Re_s/(V_{22}/I) \text{ or} \tag{5}$$

$$A_{22} = (L)^2 \times Re_s/(V_{22}/I) \tag{6}$$

Figure 4:
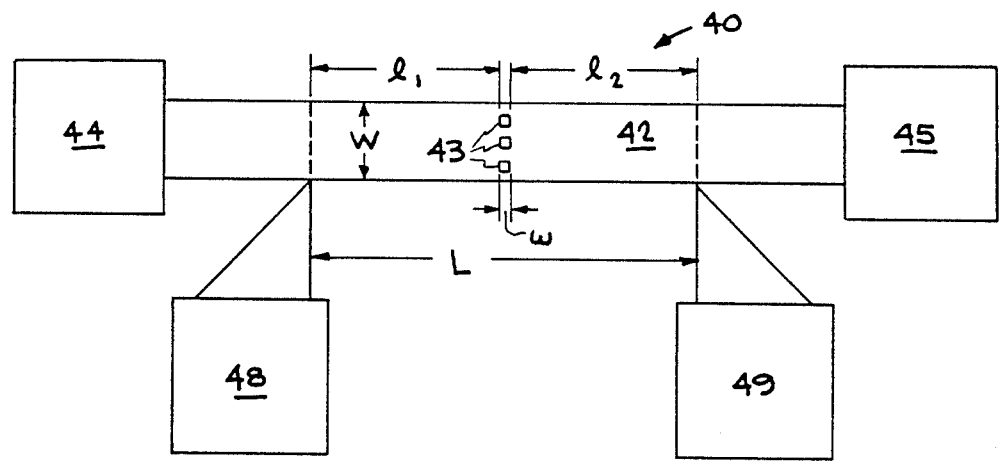
FIG. 4 is a top view of a test pattern, including measurement pads, used in the method of this invention to determine the size of the square openings formed in the test pattern line.

In accordance with the method of the present invention, this value $A_{22}$, or the measured voltage from which the area is derived, may then used as the known or standard in the subsequent determination of the area of the region in the test pattern of FIG. 4 which will contain the vias or openings to be measured.

Referring now to FIG. 4, a test pattern 40 identical in exterior dimensions to test pattern 20 of FIG. 3 is shown. Test pattern 40 is also made from the same conductive film or layer as used for the van der Pauw sheet resistance measurement of FIG. 2 and test pattern 20 of FIG. 3 and contains a test region or area 42 of identical width W and identical length L to area 22 of test pattern 22.

While test pattern area 42 has a length L between test pads 48 and 49 identical to length L between test pads 28 and 29 and an identical width W to width W of test pattern 22, it will be noted that test region or area 42 differs from area 22 in one respect in that area 42 has a plurality of square vias or openings 43 of width w formed therein which will, of course, alter the total resistance of the conductive film of area 42. This, in turn, results in a difference in the voltage drop $V_{42}$ measured between pad 48 and pad 49 from the voltage $V_{22}$ previously measured in the structure of FIG. 3 when an identical current I is passed between pad 44 and 45 as was passed between pads 24 and 25.

The solid area $A_{42}$ of region 42, representing the total area of region 42 minus the total area of the vias or openings 43, may then be calculated to determine or verify the size of openings 43 by dividing region 42 into subregions comprising, respectively, the region containing openings 43, i.e., a region of width W and length w (representing the width of the square holes 43), and the two solid regions on either side of this region, each having a width W and a total length of both regions equal to length L minus w. In the simplest case, the length of each of these two solid regions is the same and may be denoted as l where $2l + w = L$.

The voltage $V_{42}$ which will be measured across the three regions may then be expressed as:

$$V_{42} = (R_1 + R_2 + R_3)I \tag{7}$$

where $R_1$ and $R_2$ represent the respective resistances of the two solid regions and $R_3$ represents the total resistance of the solid areas between the holes.

Still using the simplified case where both solid regions are of the same length, l, the resistance of each of the solid regions may be written as $(l/W)Re_{22}$. When this term is substituted for $R_1$ and $R_2$ in equation (7) above, the equation may be rewritten as:

$$V_{42} = ((l/W)Re_{22} + (l/W)Re_{22} + R_3)I \tag{8}$$

If square holes 43 are all spaced an equal distance apart from one another and from the sides of the test pattern, each of the solid areas between the holes will have a resistance $R_{sa}$ equal to $[w/(W-wn)/(n+1)]Re_{22}$ where n is equal to the number of square holes of Width (and length) w.

Since the total resistance $R_3$ of all of the parallel resistances $R_{sa}$ is equal to the sum of the reciprocals of the parallel resistances $R_{sa}$ and the total number of such parallel resistances will be one more than the total number of holes 43 or $(n + 1)$, the term $R_3$ in equations (7) and (8) above may be written as:

$$R_3 = [w/(W-wn)/(n+1)]Re_{22}/(n+1) \text{ or} \tag{9}$$

$$R_3 = [w/(W-wn)]Re_{22} \tag{10}$$

Thus, for example, when the width W of the test patterns 20 and 40 is equal to 10 microns, the width and length of square opening 43 are equal to 1 micron, and the number of such openings is 3, $R_3$ would be equal to $[1/(10-(1\times3))]Re_{22} = 1/7 Re_{22} = 0.1429 Re_{22}$.

Equation (8) may thus be rewritten as:

$$V_{42} = ((l/W)Re_{22} + (l/W)Re_{22} + [W/(W-wn)]Re_{22})I \tag{11}$$

or $$V_{42} = ((l/W) + (l/W) + [w/(W-wn)])Re_{22}I \tag{12}$$

Solving this equation for w, the width and length of square hole 43:

$$w = \frac{W(WV_{42} - 2lIRe_{22})}{WIRe_{22} + n(WV_{42} - 2lIRe_{22})} \tag{13}$$

While the foregoing seems somewhat complicated, it must be pointed out that the only change in resistivity based on the presence of holes 43 which will be noted by a change in the measured voltage from the voltage of equation (2) will, in the case just described, be a change in $R_3$. In other words, the resistance $R_3$, in equation (2) would have been $w/W \times Re_{22}$, while the same resistance now is $[w/(W-wn)]Re_{22}$.

Therefore, the change $V_c$ in measured voltage could be written as:

$$V_c = [w/W - w/(W-wn)]Re_{22}I. \tag{14}$$

Solving this equation for w yields:

$$w = \sqrt{\frac{WV_c}{4nRe_{22}I} \times (4W + n)} - \frac{WV_c}{2Re_{22}I} \tag{15}$$

Figure 5:
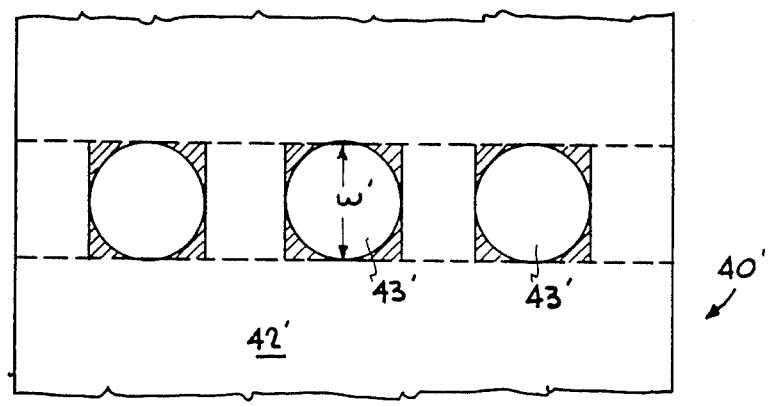
FIG. 5 is a fragmentary top view of a test pattern containing generally circular openings.

While the foregoing describes the measurement or verification of the size of holes 43 when the holes are square, a correctional factor must be included when the holes are other than square. For example, as shown in FIG. 5, when the holes 43' are circular, the conductive space between the holes will be larger by an amount equal to the area $w'^2$ minus the area of the circle when $w'$ is the diameter of the circle as shown by the shaded space in FIG. 5.

Thus equation (14) above would have to be modified to take into account the additional conductive area and the resulting lowering of the resistance as follows:

$$V_c = \tag{16}$$

-continued $$\left[\frac{w'}{W} - \frac{w'^2}{w'(W-w'n) + n\left(w'^2 - pi\left(\frac{w'}{2}\right)^2\right)}\right] Re_{22}I$$

To further illustrate the invention, if a solid test pattern formed from conductive material of length L = 21 microns and width W = 10 microns and a resistivity of 10,000 ohms per square had a current of 1 microampere passed through it, the theoretical voltage drop from one end of the test pattern to the other end which should be measurable would, according to equation (2) be:

$$V = (21/10 \times 10^5) \times 1^{-6} = 0.21 \text{ volts.}$$

If the same test pattern had three square holes of 1 micron width and length formed equidistantly apart across the width of the test pattern, the measured voltage, found by using equation (12), would be:
$$V = ((1/10) + (1/10) + [1/(10-3)]) \times 10^5 \times 10^{-6}$$ or $(10/10 + 10/10 + 1/7) \times 10^5 \times 10^{-6} = 0.21429$, or a difference of 0.00429 volts Alternatively, using equation (14), the voltage difference would be calculated as:
$$V_c = [1/10 - 1/(10-3)] \times 10^5 \times 10^{-6} \text{ or}$$
$$. (1/10 - 1/7) \times 10^5 \times 10^{-6} = -0.00429 \text{ volts}$$

If instead of square holes, the 1 micron holes were round holes, equation (16) would be used instead of equation (14) as follows:

$$V_c = \left[\frac{1}{10} - \frac{1}{1(10-3) + 3(1-3.14(\frac{1}{2})^2)}\right] \times 10^{-1}$$
$$= \left[\frac{1}{10} - \frac{1}{7.64}\right] \times 10^{-1}$$
$$= -0.003089 \text{ volts}$$

Thus, the size of one or more vias formed in a conductive film can be electrically measured and since by standard photolithography techniques this size opening or via can be dimensionally reproduced accurately, the size of an identically produced via in an insulating film can be determined by the electrical measurement method of this invention.

Having thus described the invention, what is claimed is:

1. A method for measuring the lateral size of openings which extend through a layer of material which comprises:
   (a) measuring the voltage drop while flowing a known current through a given length of a first rectangular test pattern comprising a continuous layer of a material capable of carrying an electrical current;
   (b) measuring the voltage drop while flowing the same known current through the same length of a second rectangular test pattern comprising another portion of said same layer of material and of identical width and length as said first test pattern but with openings formed through said second test pattern; and
   (c) determining the lateral size of said openings in said second test pattern from the number of said openings and the electrically measured difference in voltage drops between said first and second test patterns.

2. The method of claim 1 including the further step of electrically determining the sheet resistance of said layer of material.

3. The method of claim 2 wherein said openings are square and the step of determining the size of said openings includes using the following equation to determine the width of the square opening from the change in said measured voltage drops:

$$w = \sqrt{\frac{WV_c}{4nRe_{22}I} \times (4W + n)} - \frac{WV_c}{2Re_{22}I}$$

Wherein:
w is the width of each opening;
W is the width of the rectangular test portion;
Vc is the measured change voltage in voltage drops between said first and second rectangular test patterns;
n is the number of openings;
Re is the sheet resistance of the layer of material; and
I is the current flow through the test portions.

4. The method of claim 2 wherein said openings are round and the step of determining the size of said openings includes using the following equation to determine the diameter of the round opening from the change in said measured voltage drops:

$$V_c = \left[\frac{w'}{W} - \frac{w'^2}{w'(W-w'n) + n\left(w'^2 - pi\left(\frac{w'}{2}\right)^2\right)}\right] Re_{22}I$$

Wherein:
w' is the diameter of each opening;
W is the width of the rectangular test portion;
Vc is the measured change voltage in voltage drops between said first and second rectangular test patterns;
n is the number of openings;
Re is the sheet resistance of the layer of material; and
I is the current flow through the test portions.

5. A method of determining the dimensions of a via in an integrated circuit structure which comprises:
   (a) forming a first rectangular test pattern of a continuous conductive film on a substrate;
   (b) forming a second rectangular test pattern of the same conductive film on a substrate having the same width and thickness as said first test pattern but having formed therethrough one or more openings;
   (c) measuring the voltage drops of said first and second test patterns for the same length of each test pattern while flowing the same known amount of current through each of said test patterns; and
   (d) determining the size of each of said openings using the difference in voltage drops between the two test patterns and the number of openings in said second test pattern.

6. The method of claim 5 wherein said method further comprises the step of measuring the sheet resistance of said conductive film.

7. The method of claim 5 wherein said step of determining the size of each of said openings further comprises using the length and width of the test patterns, the sheet resistance, and the number of openings to determine the width of each opening.

8. The method of claim 7 wherein the width of each test pattern is determined from the measured voltage drop, the length of the test pattern and the sheet resistivity for a given current flow through the test pattern.

9. A method of monitoring the size of vias formed in an integrated circuit structure which comprises:
   (a) forming a rectangular test pattern of a continuous conductive film on a substrate having a known width and thickness and a known number of vias of known shape but unknown size which extend through said conductive film;
   (b) measuring the voltage drop of said test pattern while flowing a known amount of current through said test pattern;
   (c) measuring the sheet resistance of said conductive film; and
   (d) comparing the measured voltage drop with a theoretical voltage drop amount calculated for a known number, size, and shape of vias.

10. A method of determining the width of square vias in an integrated circuit structure which comprises:
    (a) forming a first rectangular test pattern of a continuous conductive film on a substrate;
    (b) forming a second rectangular test pattern of the same conductive film on a substrate having the same width and thickness as said first test pattern but having formed therein a plurality of square vias which extend through said conductive film;
    (c) measuring the voltage drops of said first and second test patterns for the same length of each test pattern while flowing the same known amount of current through each of said test patterns;
    (d) measuring the sheet resistance of said conductive film; and
    (e) determining the size of said square vias using the difference in voltage drops between said two test patterns and the number of vias in said second test pattern in accordance with the following equation:

$$w = \sqrt{\frac{WV_c}{4nRe_{22}I} \times (4W + n)} - \frac{WV_c}{2Re_{22}I}$$

Wherein:
w is the width of each via;
W is the width of the rectangular test portion;
Vc is the measured change voltage in voltage drops between said first and second rectangular test patterns;
n is the number of vias;
Re is the sheet resistance of the layer of material; and
I is the current flow through the test portions.

11. A method of determining the diameter of a circular via in an integrated circuit structure which comprises:
    (a) forming a first rectangular test pattern of a continuous conductive film on a substrate;
    (b) forming a second rectangular test pattern of the same conductive film on a substrate having the same width and thickness as said first test pattern but having formed therein one or more circular vias which extend through said conductive film;
    (c) measuring the voltage drops of said first and second test patterns for the same length of each pattern while flowing the same known amount of current through each of said test patterns;
    (d) measuring the sheet resistance of said conductive film; and
    (e) determining the diameter of each of said circular vias using the difference in voltage drops between said two test patterns and the number of circular vias in said second test pattern in accordance with the following equation:

$$V_c = \left[ \frac{w}{W} - \frac{w'^2}{w'(W - w'n) + n\left(w'^2 - pi\left(\frac{w'}{2}\right)^2\right)} \right] Re_{22}I$$

Wherein:
w, is the diameter of circular via;
W is the width of the rectangular test portion;
Vc is the measured change voltage in voltage drops between said first and second rectangular test portions;
n is the number of circular vias;
Re is the sheet resistance of the layer of material; and
I is the current flow through the test portions.

12. A method for measuring the lateral size of vias which extend through a layer of insulating material using electrical measurements to determine the equivalent lateral size of vias formed in a conductive material using the same photolithographic mask which comprises:
    (a) measuring the voltage drop while flowing a known current through a given length of a first rectangular test pattern comprising a continuous layer of a conductive material;
    (b) measuring the voltage drop while flowing the same known current through the same length of a second rectangular test pattern comprising another portion of said same layer of conductive material and of identical width and length as said first test pattern but with vias formed therein which extend through said layer of conductive material;
    (c) measuring the resistivity of said layer of conductive material; and
    (d) determining the lateral size of said vias in said second test pattern from the electrically measured difference in voltage drops between said first and second test patterns and the resistivity of said layer of conductive material;
to thereby determine the equivalent lateral size of vias formed in an insulating layer using the same photolithography mask.

* * * * *